United States Patent
Fujiwara et al.

(10) Patent No.: US 10,553,300 B2
(45) Date of Patent: Feb. 4, 2020

(54) METHOD OF DETECTING ADDRESS DECODING ERROR AND ADDRESS DECODER ERROR DETECTION SYSTEM

(71) Applicant: TAIWAN SEMICONDUCTOR MANUFACTURING COMPANY, LTD., Hsinchu (TW)

(72) Inventors: Hidehiro Fujiwara, Hsinchu (TW); Ching-Wei Wu, Caotun Town (TW); Chun-Hao Chang, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/902,838

(22) Filed: Feb. 22, 2018

(65) Prior Publication Data

US 2018/0358106 A1    Dec. 13, 2018

Related U.S. Application Data

(60) Provisional application No. 62/517,757, filed on Jun. 9, 2017.

(51) Int. Cl.
*G11C 29/02* (2006.01)
*G11C 11/40* (2006.01)
(Continued)

(52) U.S. Cl.
CPC .............. *G11C 29/024* (2013.01); *G11C 8/10* (2013.01); *G11C 29/00* (2013.01); *G11C 29/18* (2013.01); *G11C 2029/1802* (2013.01)

(58) Field of Classification Search
CPC ..... G11C 29/42; G11C 29/021; G11C 29/028; G11C 16/26; G11C 11/5642;
(Continued)

(56) References Cited

U.S. PATENT DOCUMENTS 6,438,726 B1 *  8/2002  Walters, Jr. .......... G06F 11/1008
                                                       711/106
6,934,796 B1 *  8/2005  Pereira .................. G11C 15/00
                                                       365/49.17
(Continued)

FOREIGN PATENT DOCUMENTS

JP          3-78346      8/1991
TW          432279       5/2001

OTHER PUBLICATIONS

Office Action dated Aug. 28, 2019 from corresponding application No. KR 10-2018-0035094.
(Continued)

*Primary Examiner* — Jerome Leboeuf
(74) *Attorney, Agent, or Firm* — Hauptman Ham, LLP

(57) ABSTRACT

A system for detecting an address decoding error of a semiconductor device, includes: decoding an original address, with an address decoder of the semiconductor device, to form a corresponding decoded address; recoding the decoded address, with an encoder of the semiconductor device, to form a recoded address; making a comparison, with a comparator of the semiconductor device, of the recoded address and the original address; and detecting an address decoding error based on the comparison.

20 Claims, 13 Drawing Sheets

(51) Int. Cl.
   *G11C 8/10*    (2006.01)
   *G11C 29/18*   (2006.01)
   *G11C 29/00*   (2006.01)

(58) Field of Classification Search
   CPC . G11C 29/50004; G11C 29/52; G11C 16/349;
              G11C 2029/0411; G11C 7/14; G11C
           2029/5004; G06F 11/1012; G06F 11/004;
                                      G06F 11/1048
   See application file for complete search history.

(56) References Cited

U.S. PATENT DOCUMENTS 9,384,144 B1 *   7/2016  Yeung .................. G06F 11/1016
   9,711,221 B1 *   7/2017  Li ......................... G11C 15/046
   2010/0107006 A1  4/2010  Fey et al.
   2015/0121034 A1* 4/2015  Steele, Jr. ............ G06F 12/1018
                                                          711/216

OTHER PUBLICATIONS

Office Action dated Oct. 31, 2019 from corresponding application No. TW 107119834.

* cited by examiner

METHOD OF DETECTING ADDRESS DECODING ERROR AND ADDRESS DECODER ERROR DETECTION SYSTEM

BACKGROUND

An integrated circuit ("IC") includes one or more semiconductor devices. The recent trend in miniaturizing ICs has resulted in smaller devices (comprised of smaller components), e.g., memory ICs, which operate at lower voltages and consume less power yet provide the same or increased functionality at higher speeds. With such miniaturization, memory ICs have become more susceptible to thermally induced errors, radiation induced errors, or the like. Types of damage to a semiconductor device caused by radiation include persistent lattice displacement (which typically is persistent) and/or ionization effects (which typically is transient). Types of errors in the operation of the semiconductor device (operational errors) include hard/permanent errors and soft/one-time errors. Lattice displacement tends to induce hard/permanent operational errors. Ionization effects tend to produce soft/one-time operational errors. Thermally induced operational errors tend to be soft/one-time operational errors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
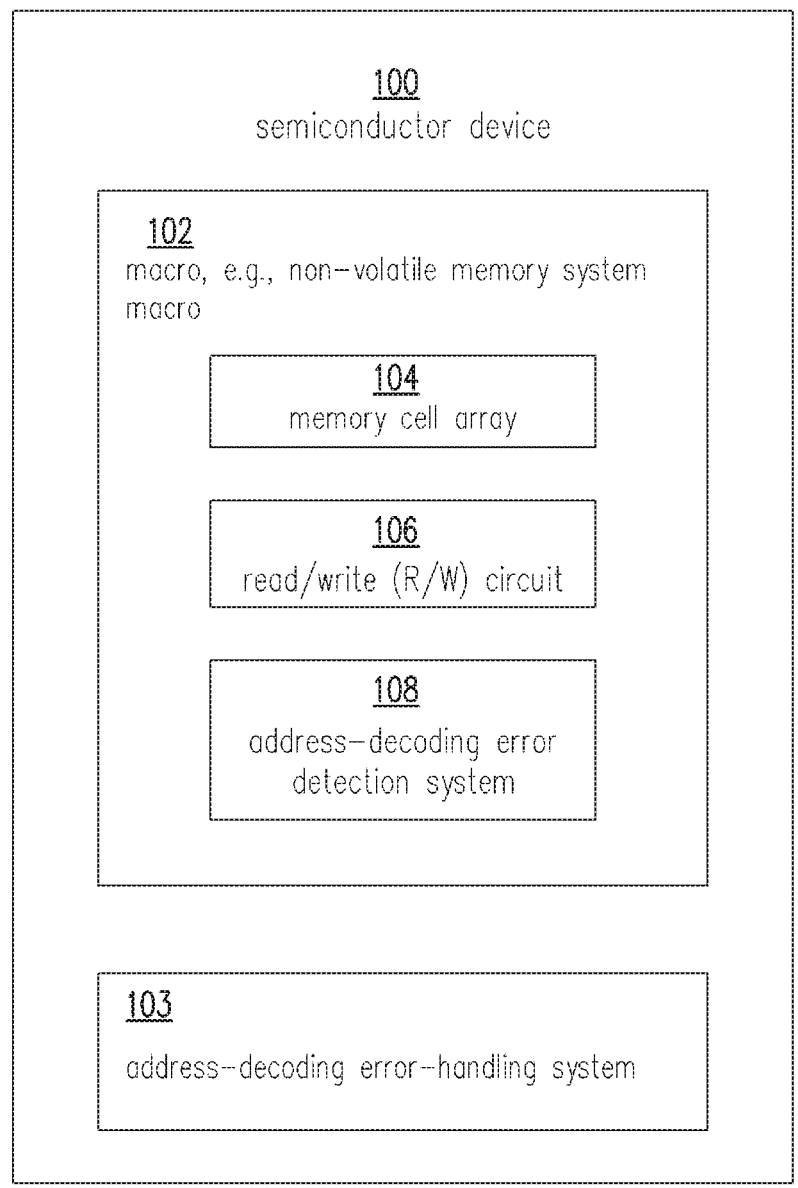
FIG. 1 is a block diagram of a semiconductor device, in accordance with at least one embodiment of the present disclosure.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to at least one embodiment of the present disclosure, in the context of decoding an original address, an error in the address-decoding is detected by comparing a recreated version of the original address against the original address. In some embodiments, an encoder recodes the original address to form the recreated version of the original address. The recoded address is compared against the original address and an error flag is set if the recoded address and the original address are not the same. According to another approach, an error in the address-decoding is detected by: using first and second redundant address decoders to generate corresponding first and second redundant decoded addresses; comparing the first and second redundant decoded addresses; and setting an error flag if the first and second redundant decoded addresses are not the same. In contrast to using first and second redundant decoded addresses, a benefit of using an encoder to recode the decoded address (in accordance with at least one embodiment of the present disclosure) is that the footprint of the encoder is smaller than the footprint of the redundant second address decoder, which results in an address-decoding error detection system having a smaller footprint than the address-decoding error detection system of the other approach. Decreasing the size of components which comprise a semiconductor device, e.g., by using the encoder instead of a redundant second decoder, provides one or more of the following benefits: faster operation; a reduction in the overall size of the IC; reduced cost of materials; or the like.

FIG. 1 is a block diagram of a semiconductor device 100, in accordance with at least one embodiment of the present disclosure.

In FIG. 1, semiconductor device 100 includes, among other things, circuit macros/modules 102 and 103. In some embodiments, semiconductor device 100 is included within an integrated circuit. In some embodiments, circuit macros/modules 102 and 103 are understood in the context of an analogy to the architectural hierarchy of modular programming in which subroutines/procedures are called by a main program (or by other subroutines) to carry out a given computational function. In this context, semiconductor device 100 uses circuit macros/modules 102 and 103 to perform corresponding one or more given functions. Accordingly, in this context and in terms of architectural hierarchy, semiconductor device 100 is analogous to the main program and circuit macros/modules (hereinafter, macros) 102 and 103 are corresponding analogous to subroutines/procedures. In some embodiments, macros 102 and 103 are corresponding soft macros. In some embodiments, macros 102 and 103 are corresponding hard macros. In some embodiments, macros 102 and 103 are corresponding soft macros which are described/couched in corresponding register-transfer level (RTL) code. In some embodiments, synthesis, placement and routing have yet to have been performed on macros 102 and 103 such that the corresponding soft macros can be synthesized, placed and routed for a variety of process nodes. In some embodiments, macros 102 and 103 are corresponding hard macros which are described/couched in a binary file format (e.g., Graphic Database System II (GDSII) stream format), where the binary file format represents planar geometric shapes, text labels, other information or the like of one or more layout diagrams of corresponding macros 102 and 103 are corresponding in hierarchical form. In some embodiments, synthesis, placement and routing have been performed on macros 102 and 103 are corresponding such that the corresponding hard macros are specific to a particular process node.

In some embodiments, macro 102 is a memory macro. In some embodiments, macro 102 is a non-volatile memory macro. In some embodiments, macro 102 is a Read Only Memory (ROM) system macro. In some embodiments, macro 102 is a memory system macro other than a ROM system macro. Macro 102 includes, among other things, an array 104 of memory cells, a read/write (R/W) circuit 106 and an address-decoding error detection system 108 (see FIG. 2). In some embodiments, macro 103 is an address-decoding error-handling system. In some embodiments, the address-decoding error-handling system is not a macro but instead is implemented as one or more components (not shown) in macro 102. In some embodiments in which semiconductor device 100 is itself included in a system 100' (not shown), address-decoding error-handling system 103 is not a macro included in semiconductor device 100 but instead is implemented as one or more devices (not shown) in system 100'.

Figure 2:
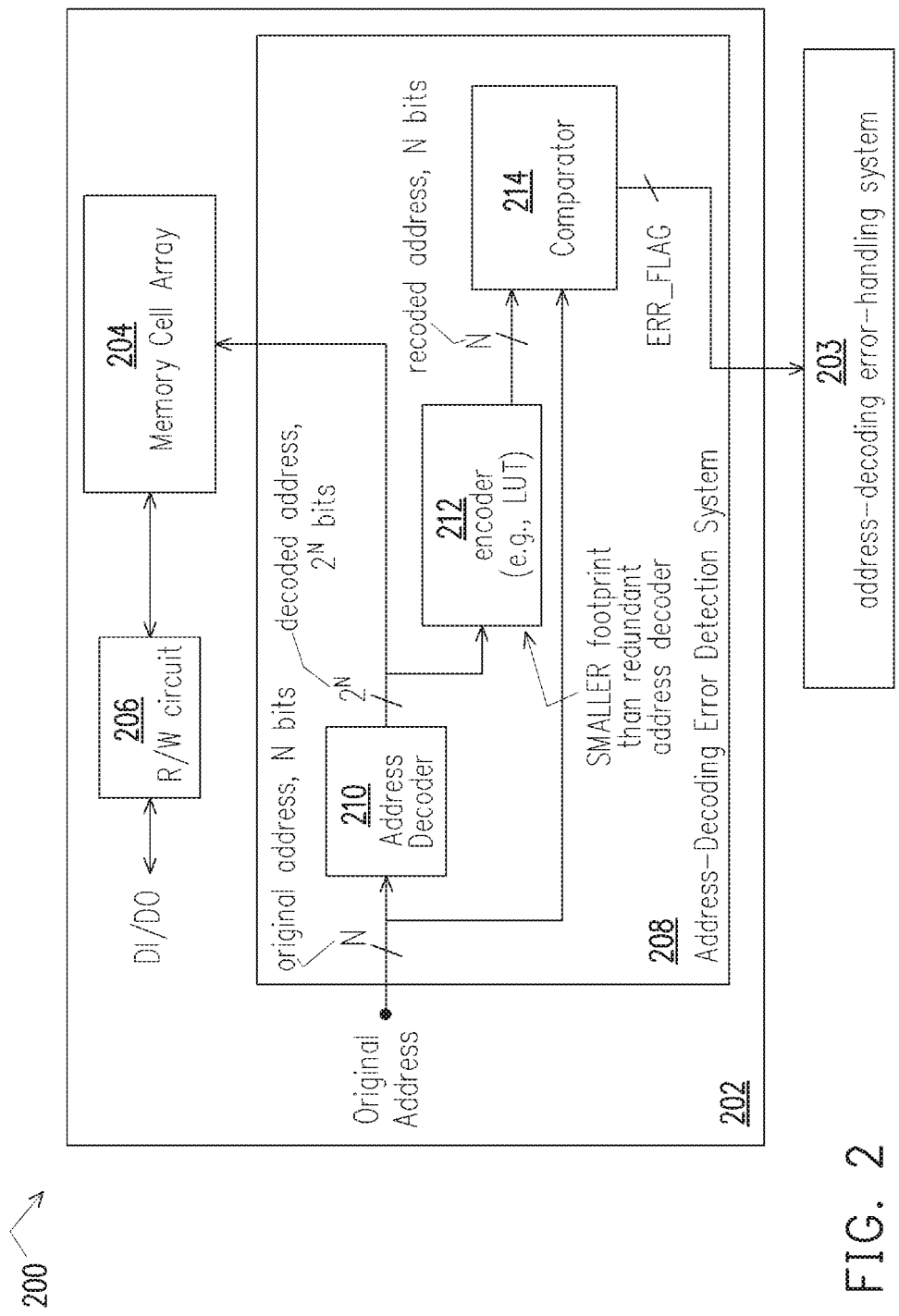
FIG. 2 is a block diagram of a memory system including an address-decoding error detection system, in accordance with at least one embodiment of the present disclosure.

FIG. 2 is a block diagram of a semiconductor device 200 including a memory system 202 (which includes an address-decoding error detection system 208) and an address-decoding error-handling system 203, in accordance with at least one embodiment of the present disclosure.

In FIG. 2, memory system 202 includes an array 204 of memory cells and a R/W circuit 206 in addition to address-decoding error detection system 208. In some embodiments, memory system 202 is macro 102 of FIG. 1. In some embodiments, address-decoding error detection system 208 is address-decoding error detection system 108 of FIG. 1. In some embodiments, memory cell array 204 is memory cell array 104 of FIG. 1. In some embodiments, R/W circuit 206 is R/W circuit 106 of FIG. 1.

In some embodiments, address-decoding error-handling system 203 is not a macro but instead is implemented as one or more components (not shown) in memory system 202. In some embodiments in which semiconductor device 200 is itself included in a system 200' (not shown), address-decoding error-handling system 203 is not a system included in semiconductor device 200 but instead is implemented as one or more devices (not shown) in system 200'.

Address-decoding error detection system 208 includes: an address decoder 210; an encoder 212 and a comparator 214. In the context of a memory access operation by which one or more memory cells in memory cell array 204 are to be accessed, address-decoding error detection system 208 receives an original address identifying one or more cells in memory cell array 204. In FIG. 2, the original address is shown as including N binary bits, where N is a positive integer. In some embodiments, the original address includes something other than N binary bits. Each of address decoder 210 and comparator 214 receives the N bit original address. Address decoder 210 decodes the N bit original address to form a corresponding decoded address. In some embodiments, the decoded address includes more bits than the original address. In FIG. 2, the decoded address is shown as including $2^N$ binary bits. In some embodiments, the decoded address includes something other than $2^N$ binary bits. The $2^N$ bit decoded address is provided to memory cell array 204. If the memory access operation is a write operation, then R/W circuit 206 receives input data (DI) and provides the same to memory cell array 204. If the memory access operation is a read operation, then R/W circuit 206 receives output data (DO) from memory cell array 204 and outputs the same.

For address-decoding error detection system 208, the $2^N$ bit decoded address is also provided to encoder 212. Encoder 212 implements a mapping of a first set of possible values for the decoded address to a second set of corresponding possible values for the recoded address. In some embodiments, encoder 212 implements a look-up table (LUT). In some embodiments, encoder 212 is a Read Only Memory (ROM). In some embodiments, encoder 212 is a non-volatile memory other than a LUT or a ROM. In some embodiments, the mapping which encoder 212 provides is fixed at the time of manufacture of address-decoding error detection system 208.

In FIG. 2, the $2^N$ bit decoded address is recoded by encoder 212 into an N bit recoded address. Comparator 214 receives the N bit recoded address and compares it against the N bit original address. In some embodiments, comparator 214 is configured to make a bitwise (bit-by-bit) comparison of the N bit recoded address and the N bit original address. If comparator 214 determines that the N bit original address and the N bit recoded address differ from each other, then comparator 214 sets an error flag ERR_FLAG to an error-indicative state, and outputs the same to address-decoding error-handling system 203.

In some embodiments, if comparator 214 sets an error flag ERR_FLAG to an error-indicative state, then address-decoding error-handling system 203 handles/responds-to the responds to the error (which caused the error flag ERR_FLAG to be set to an error-indicative state) as follows: system 203 resets the operation of memory system 202; system 203 determines if the error is a soft/one-time type of error or a hard/permanent type of error; and repeats, if the error is a soft/one-time type of error, the operation which caused the error. In some embodiments, if the error is a hard/permanent type of error, then error-handling system 203 outputs a hard/permanent error signal external to memory system 202. In some embodiments, error-handling system 203 outputs the hard/permanent error signal externally to semiconductor device 200. In some embodiments in which semiconductor device 200 is itself included in system 200' (again, not shown), the generation of the hard/permanent error signal by address-decoding error-handling system 203 identifies semiconductor device 200 as being defective and triggers a maintenance operation on system 200' by which the defective instance of semiconductor device 200 is replaced with a non-defective instance of semiconductor device 200.

In contrast to another approach which uses first and second redundant decoded addresses where the second redundant decoded address is obtained through use of a second redundant address decoder, a benefit of using encoder 212 to recode the decoded address is that the footprint of encoder 212 is smaller than the footprint of the redundant second address decoder. As a result, address-decoding error detection system 208 has a smaller footprint than the address-decoding error detection system of the other approach (which uses redundant first and second decoders). Decreasing the size of components which comprise a semiconductor device, e.g., by using encoder 212 instead of a redundant second decoder, provides one or more of the following benefits: faster operation; a reduction in the overall size of the IC; reduced cost of materials; or the like.

Figure 3A:
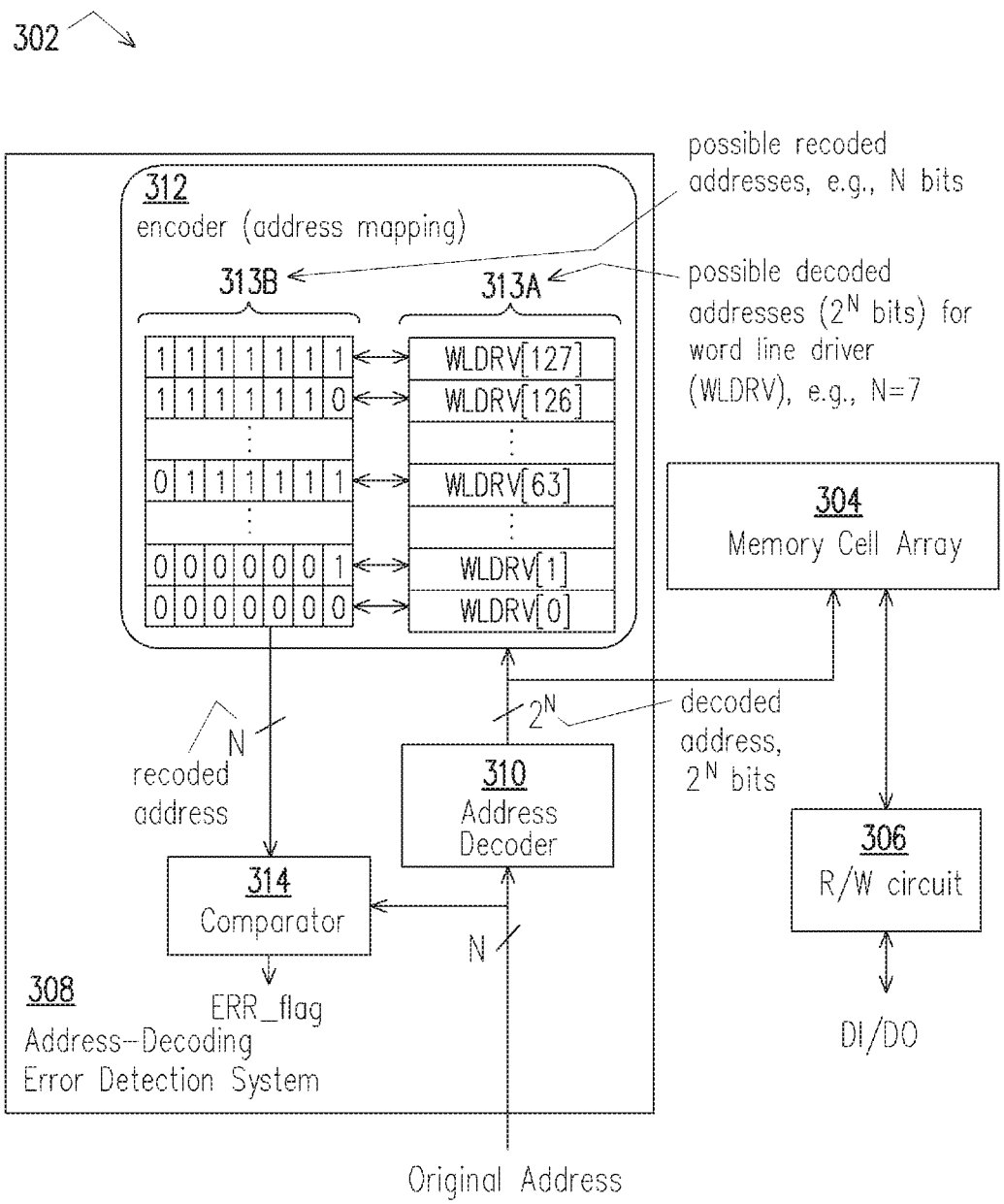
FIG. 3A is another block diagram of a memory system including an address-decoding error detection system, in accordance with at least one embodiment of the present disclosure.

FIG. 3A is a block diagram of a memory system 302 including an address-decoding error detection system 308, in accordance with at least one embodiment of the present disclosure.

Memory system 302 of FIG. 3A is similar to memory system 202 of FIG. 2. Relative to elements in FIG. 2, corresponding elements in FIG. 3A have reference numbers which have been increased by 100. For example, memory system 302 corresponds to memory system 202, address-decoding error detection system 308 corresponds to address-decoding error detection system 208, or the like. For the sake of brevity, the discussion will focus on differences between memory system 302 and memory system 202.

In FIG. 3A, encoder 312 implements a mapping of a first set 313A of possible values (word line driver (WLDRV)) for the decoded address to a second set 313B of corresponding possible values for the recoded address. In some embodiments, encoder 312 implements a LUT. In some embodiments, encoder 312 is a ROM. In some embodiments, encoder 312 is a non-volatile memory other than a LUT or a ROM. In some embodiments, the mapping which encoder 312 provides is fixed at the time of manufacture of address-decoding error detection system 308.

In FIG. 3A, each of the possible values for the decoded address in first set 313A includes $2^N$ bits, and each of the possible values for the recoded address in second set 313B includes N bits. In FIG. 3A, N is 7 such that each of the possible values (WLDRV[0]-WLDRV[127]) for the decoded address in first set 313A includes $2^7=128$ bits, and each of the possible values for the recoded address in second set 313B includes 7 bits. In some embodiments, N a positive integer other than 7.

In contrast to another approach which uses first and second redundant decoded addresses, a benefit of using encoder 312 to recode the decoded address is that the footprint of encoder 312 is smaller than the footprint of the redundant second address decoder. As a result, address-decoding error detection system 308 has a smaller footprint than the address-decoding error detection system of the other approach (which uses redundant first and second decoders). Decreasing the size of components which comprise a semiconductor device, e.g., by using encoder 312 instead of a redundant second decoder, provides one or more of the following benefits: faster operation; a reduction in the overall size of the IC; reduced cost of materials; or the like.

Figure 3B:
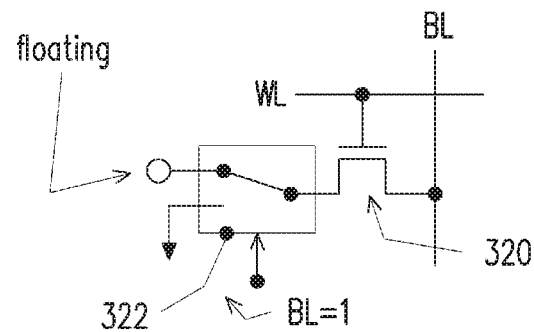
FIGS. 3B-3C are circuit diagrams of a one bit memory cell for storing a corresponding logical one datum and a logical zero datum, in accordance with at least one embodiment of the present disclosure.
Figure 3C:
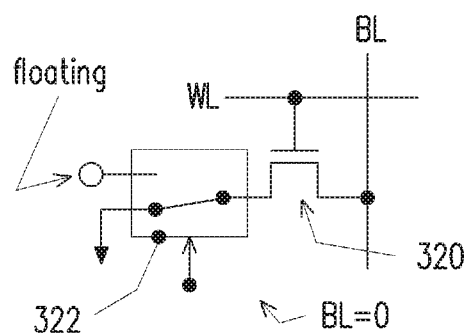

FIGS. 3B-3C are circuit diagrams of a one bit memory cell for storing a corresponding logical one datum and a logical zero datum, in accordance with at least one embodiment of the present disclosure.

In some embodiments, the one bit memory cell of FIGS. 3B-3C is used in memory cell array 304 in cooperation with a bit line BL. The one bit memory cell of each of FIGS. 3B-3C includes a transistor 320 and a switch 322 which is electronically controllable. In FIGS. 3B-3C, transistor 320 is an NMOS transistor. In some embodiments, transistor 320 is a PMOS transistor. In FIG. 3B, switch 322 is a single pole double throw (SPDT) switch. In some embodiments, switch 322 is something other than a SPDT switch. Regarding NMOS transistor 320, a first drain/source terminal thereof is connected to bit line BL, a second drain/source terminal thereof is connected to an input terminal of switch 322, and a gate terminal thereof is connected to a word line WL. Regarding switch 322, a first output terminal thereof is left floating by being connected to nothing, and a second output thereof is connected to ground.

In FIG. 3B, switch 322 is disposed in a first state for which the input terminal is connected to the first output terminal and is thus floating, which represents storage of a logical one datum. In FIG. 3C, switch 322 is disposed in a second state for which the input terminal is connected to the second output terminal and thereby to ground, which represents storage of a logical zero datum.

Figure 3D:
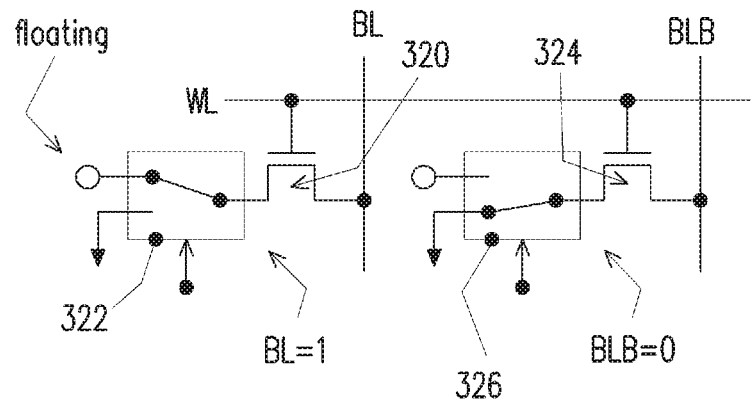
FIGS. 3D-3E are circuit diagrams of a pair of one bit memory cells storing corresponding pairs of logical one & logical zero data, and logical zero & logical one data, in accordance with at least one embodiment of the present disclosure.
Figure 3E:
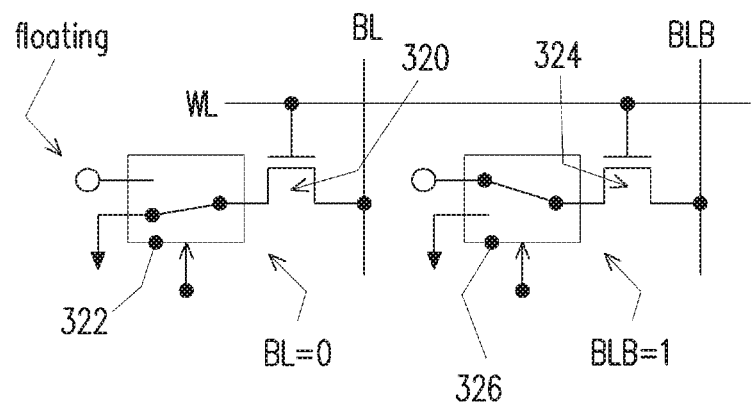

FIGS. 3D-3E are circuit diagrams of a pair of one bit memory cells storing corresponding pairs of logical one & logical zero data, and logical zero & logical one data, in accordance with at least one embodiment of the present disclosure.

In some embodiments, the pair of one bit memory cells is used in memory cell array 304 in cooperation with bit line BL and a bit_bar line BLB. The pair of one bit memory cells of each of FIGS. 3D-3E includes not only transistor 320 and a switch 322, but also a transistor 324 and a switch 326 which is electronically controllable. In FIGS. 3D-3E, transistor 324 is an NMOS transistor. In some embodiments, transistor 324 is a PMOS transistor. In FIGS. 3D-3E, switch 326 is a single pole double throw (SPDT) switch. In some embodiments, switch 326 is something other than a SPDT switch. Regarding NMOS transistor 324, a first drain/source terminal thereof is connected to bit_bar line BLB, a second drain/source terminal thereof is connected to an input terminal of switch 326, and a gate terminal thereof is connected to word line WL. Regarding switch 326, a first output terminal thereof is left floating by being connected to nothing, and a second output thereof is connected to ground.

In FIGS. 3D-3E, the one bit memory cells in the pair thereof are controlled to store the logical inverse of each other's stored datum. In FIG. 3D, switch 322 is disposed in a first state for which the input terminal is connected to the first output terminal and is thus floating, which represents storage of a logical one datum, and switch 326 is disposed in a second state for which the input terminal is connected to the second output terminal and thereby to ground, which represents storage of a logical zero datum. In FIG. 3E, switch 322 is disposed in a second state for which the input terminal is connected to the second output terminal and thereby to ground, which represents storage of a logical zero datum, and switch 326 is disposed in a first state for which the input terminal is connected to the first output terminal and is thus floating, which represents storage of a logical one datum.

Figure 4A:
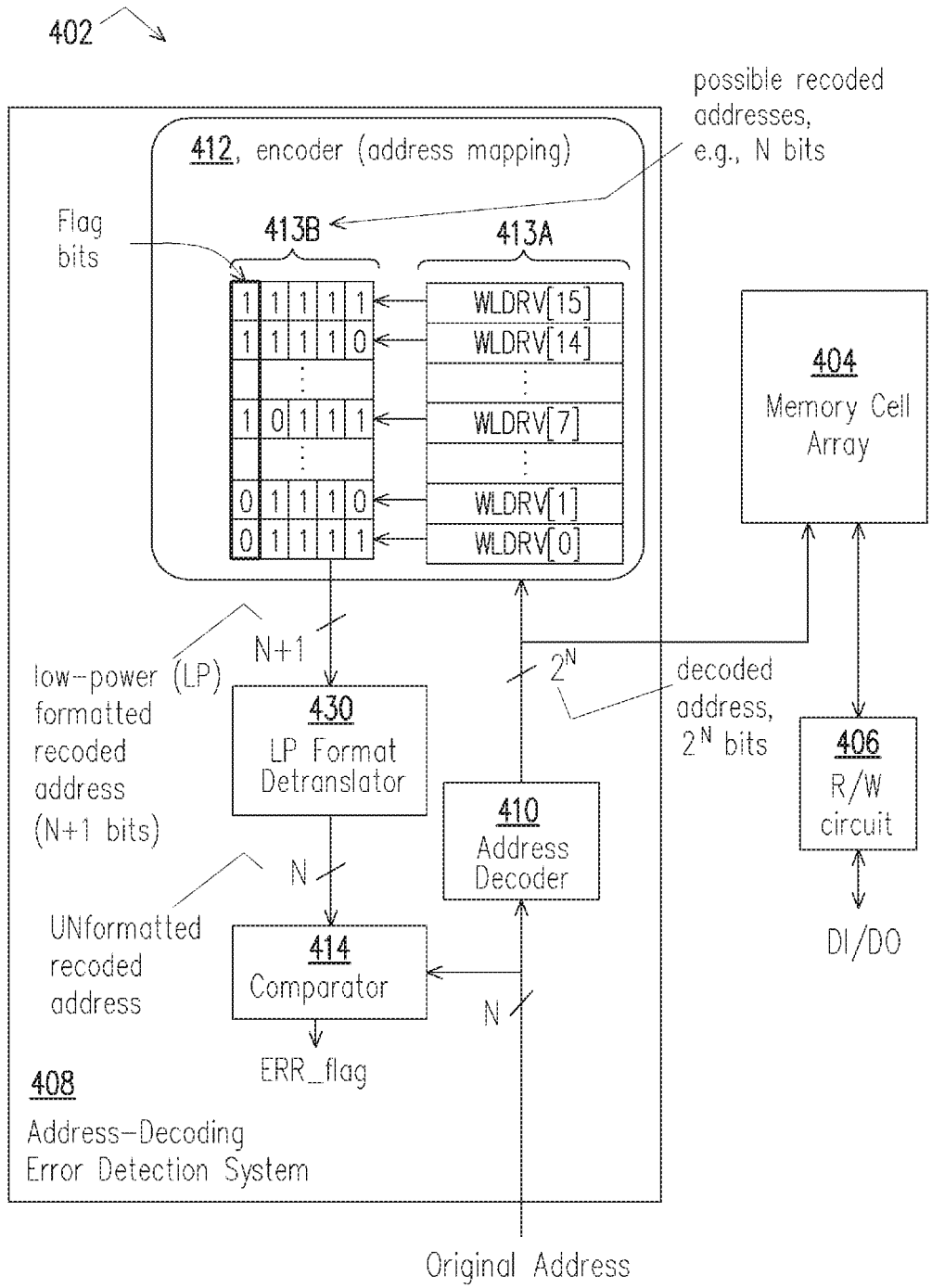
FIG. 4A is another block diagram of a memory system including an address-decoding error detection system, in accordance with at least one embodiment of the present disclosure.

FIG. 4A is a block diagram of a memory system 402 including an address-decoding error detection system 408, in accordance with at least one embodiment of the present disclosure.

Memory system 402 of FIG. 4A is similar to memory system 302 of FIG. 3A. Relative to elements in FIG. 3A, corresponding elements in FIG. 4A have reference numbers which have been increased by 100. For example, memory system 402 corresponds to memory system 302, address-decoding error detection system 408 corresponds to address-decoding error detection system 308, or the like. For the sake of brevity, the discussion will focus on differences between memory system 402 and memory system 302.

In FIG. 4A, encoder 412 implements a mapping of a first set 413A of possible values (WLDRV[i]) for the decoded address to a second set 413B of corresponding possible values for the recoded address. In contrast to second set 313B of encoder 312 for which each of the possible values for the recoded address includes N bits, each of the possible values for the recoded address in second set 413B includes N+1 bits. In FIG. 4A, for simplicity of illustration, N is 4 such that each of the possible values (WLDRV[0]-WLDRV[15]) for the decoded address in first set 413A includes $2^4=16$ bits, each of the possible values for the recoded address in second set 413B includes 5 bits. In some embodiments, N is a positive integer other than 4.

In addition to mapping, encoder 412 translates second set 413B of corresponding possible values for the recoded address into a predefined X format. A given instance of the X formatted version of the recoded address is different than a corresponding unformatted version of the recoded address. An example of the unformatted version of the recoded address is the format for second set 313B which is used by encoder 312. In some embodiments, the X format (discussed in more detail below) is a low power (LP) format. In contrast to system 308 of FIG. 3A, system 408 further includes a LP format detranslator 430.

In FIG. 4A, the $2^N$ bit decoded address (received by encoder 412 from address decoder 410) is recoded by encoder 412 and translated into an N+1 bit recoded address in the LP format. LP format detranslator 430 receives the N+1 bit, LP formatted version of the recoded address and translates the same into a corresponding N bit, unformatted version of the recoded address. Comparator 414 receives the N bit, unformatted version of the recoded address from LP format detranslator 430 and compares it against the N bit original address.

In contrast to another approach which uses first and second redundant decoded addresses, a benefit of using encoder 412 to recode the decoded address is that the footprint of encoder 412 and LP format detranslator 430, taken together, is smaller than the footprint of the redundant second address decoder. As a result, address-decoding error detection system 408 has a smaller footprint than the address-decoding error detection system of the other approach (which uses redundant first and second decoders). Decreasing the size of components which comprise a semiconductor device, e.g., by using encoder 412 instead of a redundant second decoder, provides one or more of the following benefits: faster operation; a reduction in the overall size of the IC; reduced cost of materials; or the like.

Figure 4B:
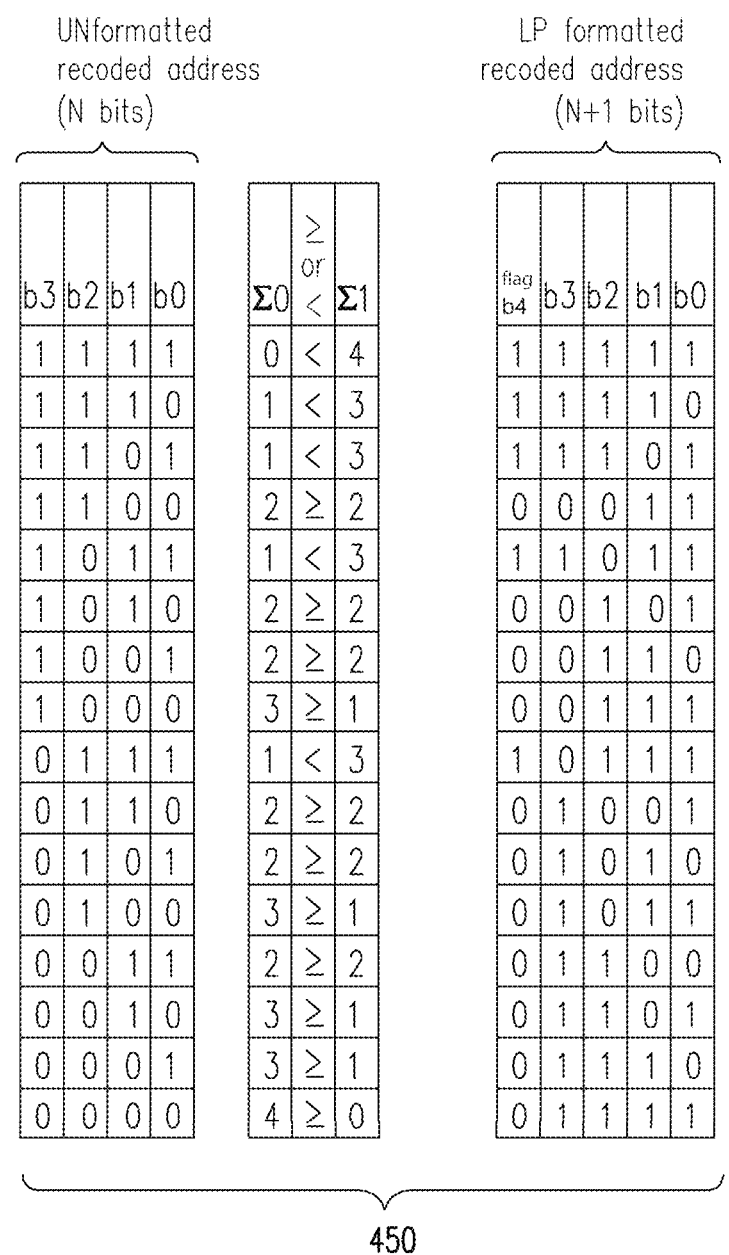
FIG. 4B is a table showing an example of low power (LP) format translation, in accordance with at least one embodiment of the present disclosure.

FIG. 4B is a table 450 showing an example of LP format translation, in accordance with at least one embodiment of the present disclosure.

An example of an encoder by which the LP format translation of table 450 can be implemented is encoder 412 of FIG. 4A. For simplicity of illustration, table 450 shows N=4. In some embodiments, N is a positive integer other than 4.

In FIG. 4B, unformatted recoded address bits are translated in table 450 as follows. For a given instance of the unformatted recoded address: if a number/count, $\Sigma 0$, of logical zeros is greater than or equal to a number/count, $\Sigma 1$, of logical ones such that $\Sigma 0 \geq \Sigma 1$, then the flag bit b(N)=b4 is set to a logical zero; and the logical values of bits b(N-1):b0 are correspondingly inverted; and if the number/count $\Sigma 1$ of logical ones is greater than the number/count $\Sigma 0$ of logical zeros such that $\Sigma 1 > \Sigma 0$, then the flag bit b(N)=b4 is set to a logical one and no change is made to the logical values of bits b(N-1):b0. A benefit of such a LP format is that fewer logical one bits are stored in second set 413B; hence, fewer logical one bits are discharged in order to read contents of encoder 412.

As an example drawn from table 450, consider the row of table 450 in which the unformatted recoded address bits b3:b0=0110, for which $\Sigma 1=2$ and $\Sigma 0=2$ such that $\Sigma 0 \geq \Sigma 1$. Accordingly, bits b3:b0 are inverted from their state in the unformatted version of the recoded address and the flag bit b4 is set to 0 such that the corresponding row of LP formatted recoded address bits b4:b0=01001.

As another example drawn from table 450, consider the row of table 450 in which the unformatted recoded address bits b3:b0=0111, for which $\Sigma 1=3$ and $\Sigma 0=1$ such that $\Sigma 1 > \Sigma 0$. Accordingly, no change is made to bits b3:b0 and the flag bit b4 is set to one such that the corresponding row of LP formatted recoded address bits b4:b0=10111.

Figure 4C:
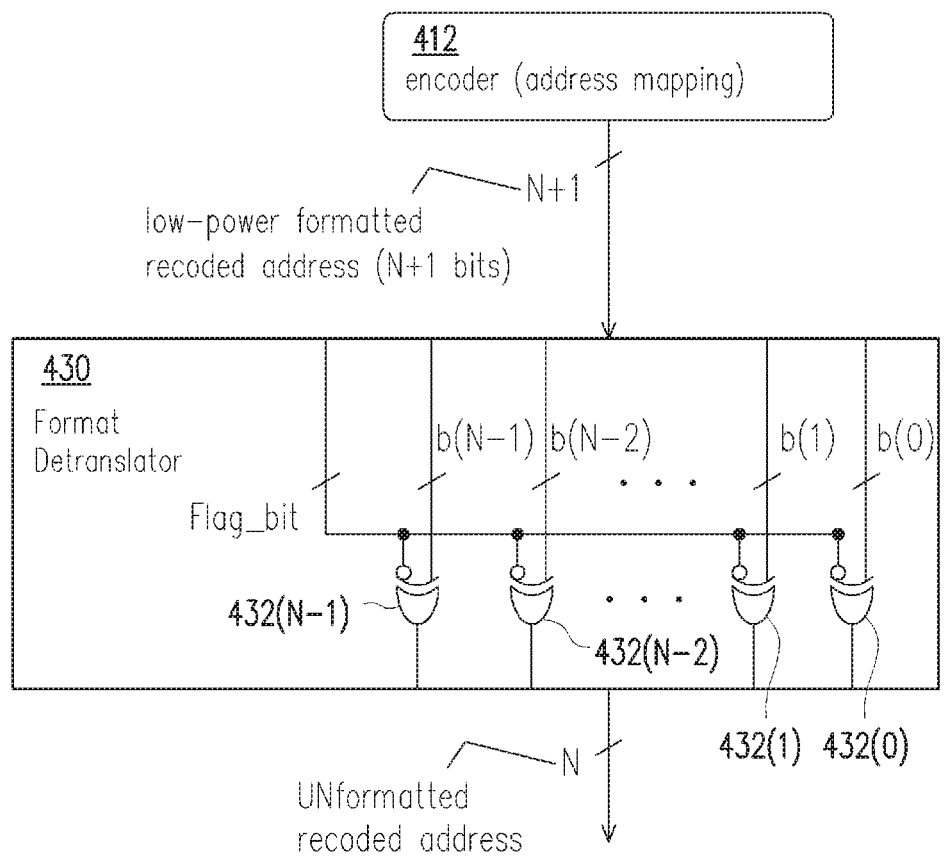
FIG. 4C is a block diagram showing a format detranslator in more detail, in accordance with at least one embodiment of the present disclosure.

FIG. 4C is a block diagram showing format detranslator 430 in more detail, in accordance with at least one embodiment of the present disclosure.

In FIG. 4C, format detranslator 430 includes N number of two-input XOR gates 432(0)-432(N-1). A first input of each of the N number of XOR gates 432(N-1)-432(0) receives a corresponding one of the N bits, b(N-1):b0, of the LP formatted recoded address which is output by encoder 412. A second input of each of the XOR gates 432(N-1)-432(0) receives the flag bit flag_bit. In some embodiments, format detranslator 430 includes an arrangement of logic other than XOR gates 432(0)-432(N-1) of FIG. 4C.

Figure 4D:
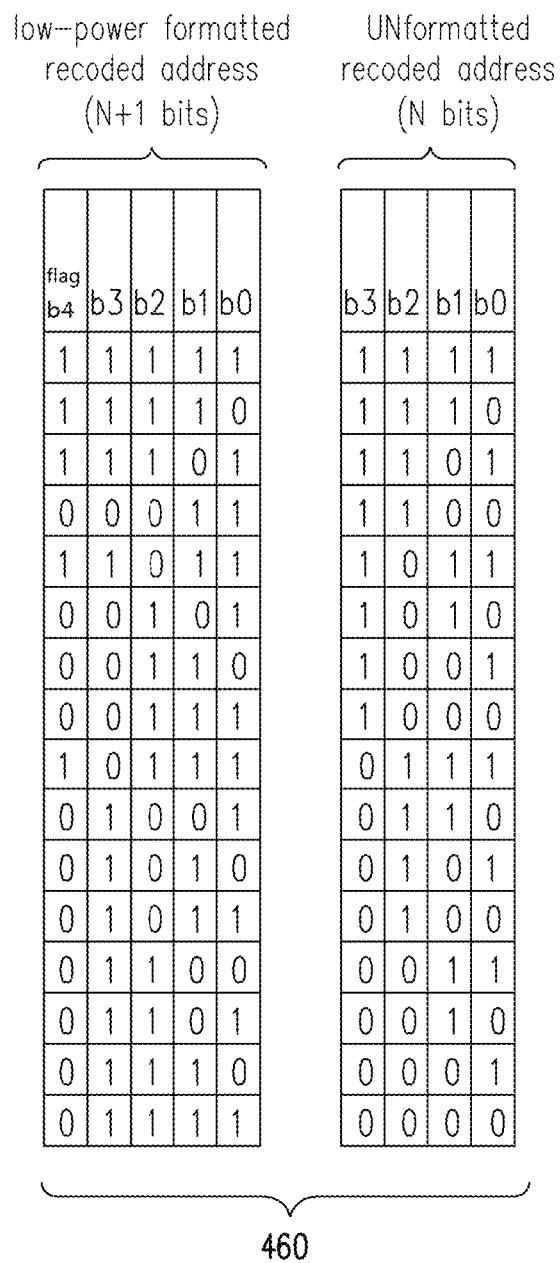
FIG. 4D is a table showing an example of LP format detranslation, in accordance with at least one embodiment of the present disclosure.

FIG. 4D is a table 460 showing an example of LP format detranslation, in accordance with at least one embodiment of the present disclosure.

An example of an LP format detranslator by which the LP format detranslation of table 450 can be implemented is LP format detranslator 430 of FIG. 4A. In FIG. 4D, for simplicity of illustration, table 460 shows N=4. In some embodiments, N a positive integer other than 4.

In FIG. 4D, LP formatted recoded address bits are detranslated in table 460 as follows. For a given instance of the LP formatted recoded address: if the flag bit b(N)=b4 is set to a logical zero, then the logical values of bits b(N−1):b0 are correspondingly inverted and the flag bit b4 is discarded; and if the flag bit b(N)=b4 is set to a logical one, then no change is made to the logical values of bits b(N−1):b0 and the flag bit b4 is discarded.

As an example drawn from table 460, consider the row of table 460 in which the LP formatted recoded address bits b3:b0=0110 and the flag bit b4=0. Accordingly, bits b3:b0 of the LP formatted recoded address are inverted to produce bits b3:b0 of the unformatted recoded address such that bits b3:b0 of the unformatted recoded address are b3:b0=1001, and the flag bit b4 is discarded.

As another example drawn from table 460, consider the row of table 460 in which the LP formatted recoded address bits b3:b0=0111 and the flag bit b4=1. Accordingly, bits b3:b0 of the LP formatted recoded address are not changed such that bits b3:b0 of the unformatted recoded address are b3:b0=0111, and the flag bit b4 is discarded.

Figure 5:
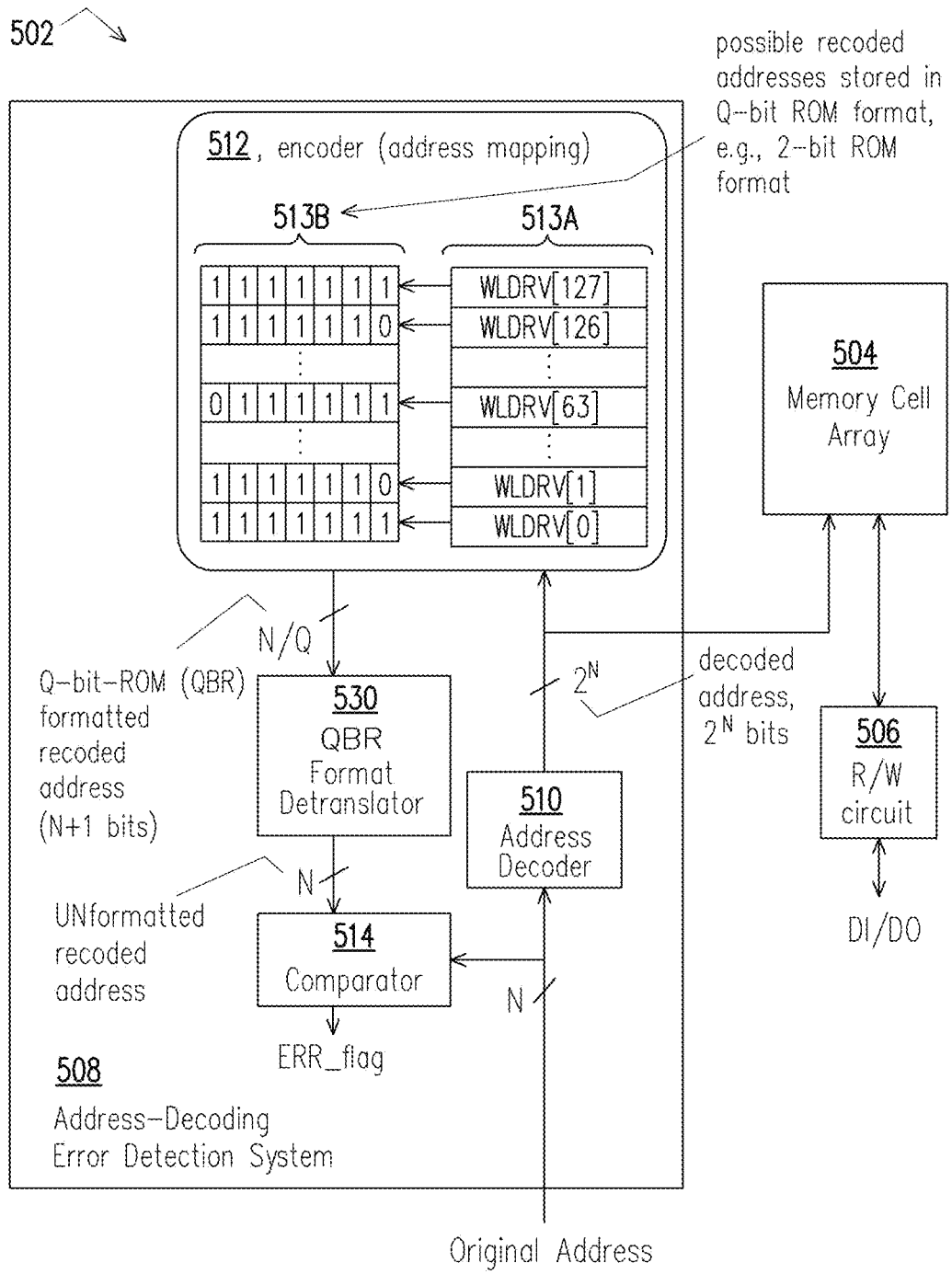
FIG. 5 is another block diagram of a memory system including an address-decoding error detection system, in accordance with at least one embodiment of the present disclosure.

FIG. 5 is a block diagram of a memory system 502 including an address-decoding error detection system 508, in accordance with at least one embodiment of the present disclosure.

Memory system 502 of FIG. 5 is similar to memory system 402 of FIG. 4A. Relative to elements in FIG. 4A, corresponding elements in FIG. 5 have reference numbers which have been increased by 100. For example, memory system 502 corresponds to memory system 402, address-decoding error detection system 508 corresponds to address-decoding error detection system 408, or the like. For the sake of brevity, the discussion will focus on differences between memory system 502 and memory system 402.

In FIG. 5, encoder 512 implements a mapping of a first set 513A of possible values (WLDRV[i]) for the decoded address to a second set 513B of corresponding possible values for the recoded address. In addition to mapping, encoder 512 translates second set 513B of corresponding possible values for the recoded address into a predefined X format. A given instance of the X formatted version of the recoded address is different than a corresponding unformatted version of the recoded address. An example of the unformatted version of the recoded address is format for second set 313B which is used by encoder 312. In some embodiments, the X format (discussed in more detail below) is a Q bit ROM (QBR) format, where Q is a positive integer and Q≥2. In some embodiments, Q=2. In some embodiments, Q is a positive integer greater than 2. In contrast to system 408 of FIG. 4A, system 508 further includes a QBR format detranslator 530. Details of QBR translation and detranslation are found, e.g., in U.S. Pat. No. 8,837,192, granted Sep. 16, 2014, the entirety of which is hereby incorporated by reference.

In FIG. 5, the $2^N$ bit decoded address (received by encoder 512 from address decoder 510) is recoded by encoder 512 and translated into an QBR formatted version of the recoded address which includes N/Q bits, where Q is a positive integer such that N/Q=U, and where U is a positive integer. N+1 bit recoded address in the QBR format. QBR format detranslator 530 receives the N+1 bit, QBR formatted version of the recoded address and translates the same into a corresponding N bit, unformatted version of the recoded address. Comparator 514 receives the N bit, unformatted version of the recoded address from QBR format detranslator 530 and compares received N bit, unformatted version against the N bit original address.

In contrast to another approach which uses first and second redundant decoded addresses, a benefit of using encoder 512 to recode the decoded address is that the footprint of encoder 512 and QBR format detranslator 530, taken together, is smaller than the footprint of the redundant second address decoder. As a result, address-decoding error detection system 508 has a smaller footprint than the address-decoding error detection system of the other approach (which uses redundant first and second decoders). Decreasing the size of components which comprise a semiconductor device, e.g., by using encoder 512 instead of a redundant second decoder, provides one or more of the following benefits: faster operation; a reduction in the overall size of the IC; reduced cost of materials; or the like.

Figure 6A:
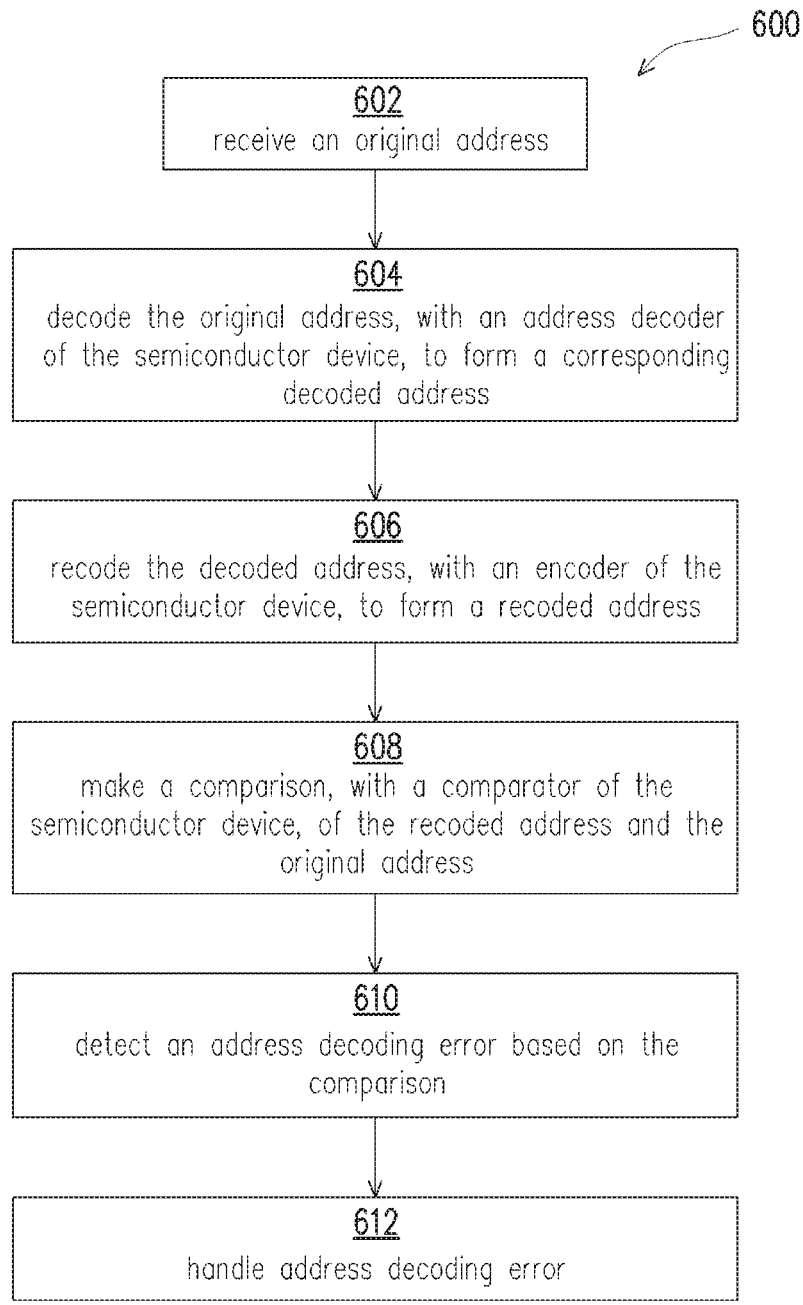
FIG. 6A is a flowchart of a method of detecting an address decoding error of a semiconductor device, in accordance with at least one embodiment of the present disclosure.

FIG. 6A is a flowchart of a method 600 of detecting an address decoding error of a semiconductor device, in accordance with at least one embodiment of the present disclosure.

An example of a semiconductor device to which method 600 is applicable is semiconductor device 100 of FIG. 1. Examples of address-decoding error detection systems which implement method 600 include address-decoding error detection systems 208, 308, 408, 508 or the like.

In FIG. 6A, method 600 includes blocks 602-612. At block 602, an original address is received. An example of the original address is original address shown in FIG. 2. From block 602, flow proceeds to block 604. At block 604, the original address is decoded to form a corresponding decoded address using an address decoder of the semiconductor device. An example of the address decoder is address decoder 210 of FIG. 2. From block 604, flow proceeds to block 606.

At block 606, the decoded address is recoded to form a recoded address using an encoder of the semiconductor device. Examples of the encoder include encoder 212 of FIG. 2 and encoder 312 of FIG. 3A, each of which outputs an N bit address. The encoder encodes the decoded address into a recoded address. In some embodiments, the encoder implements a LUT. In some embodiments, the encoder is a ROM. In some embodiments, the encoder is a non-volatile memory other than a LUT or a ROM. From block 606, flow proceeds to block 608.

At block 608 of FIG. 6, a comparison is made between the recoded address and the original address using a comparator of the semiconductor device. An example of the comparator is comparator 214 of FIG. 2. In some embodiments, the comparison is a bitwise comparison. From block 608, flow proceeds to block 610. At block 610, an error is detected based on the comparison. In some embodiments, a decoding error is deemed to have occurred if the recoded address and the original address are not the same. From block 610, flow proceeds to block 612. At block 612, the address decoding error is handled using an address-decoding error-handling system. An example of the address-decoding error-handling system is address-decoding error-handling system 203 of FIG. 2.

Figure 6B:
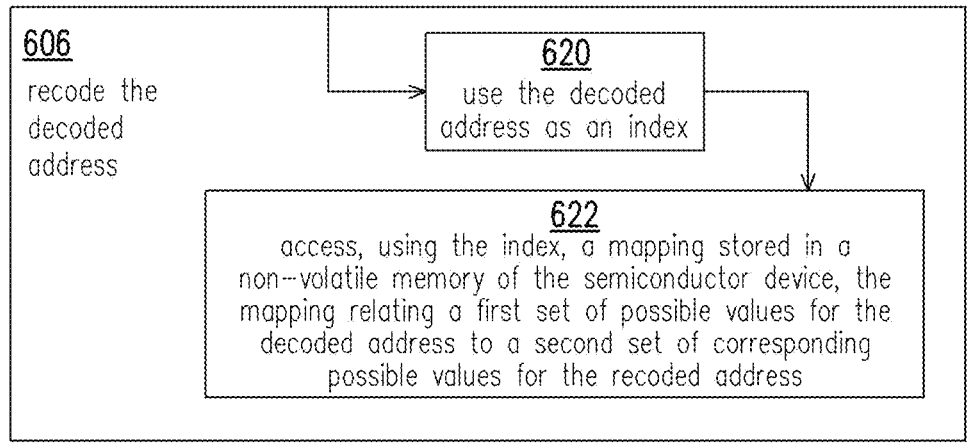
FIG. 6B is a flowchart showing a first block of FIG. 6A in more detail, in accordance with at least one embodiment of the present disclosure.

FIG. 6B is a flowchart showing block 606 of FIG. 6A in more detail, in accordance with at least one embodiment of the present disclosure.

In FIG. 6B, block 606 includes blocks 620-622. Flow proceeds inside block 606 to block 620, where the decoded address is used as an index. From block 620, flow proceeds to block 622. At block 622, a mapping is accessed using the index (again, the decoded address). The mapping relates a first set of possible values for the decoded address to a second set of corresponding possible values for the recoded address. The mapping is stored in a non-volatile memory of the semiconductor device. An example of the first set of possible values for the decoded address are first set 313A of FIG. 3A. An example of the second set of corresponding possible values for the recoded address is second set 313B of FIG. 3A. An example of the non-volatile memory is encoder 312 of FIG. 3A.

Figure 6C:
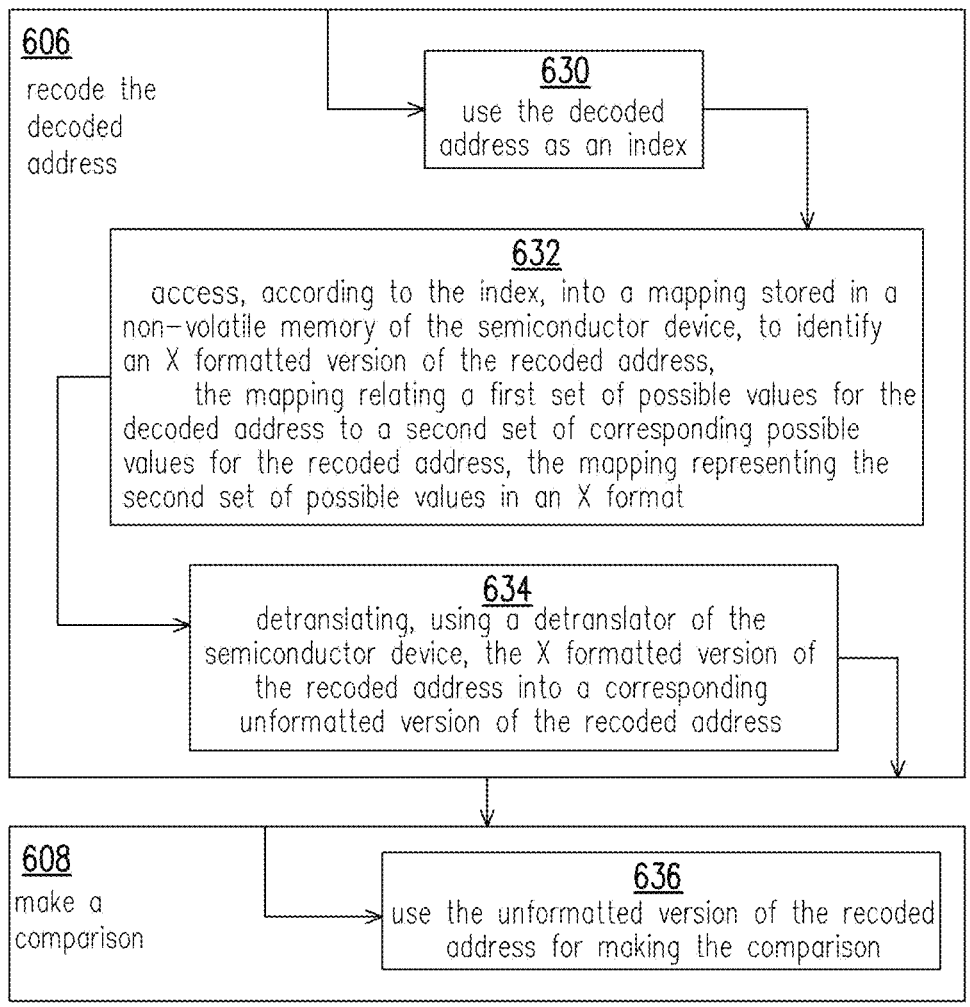
FIG. 6C is a flowchart showing the first bock and a second block of FIG. 6A in more detail, in accordance with at least one embodiment of the present disclosure.

FIG. 6C is a flowchart showing blocks 606-608 of FIG. 6A in more detail, in accordance with at least one embodiment of the present disclosure.

In FIG. 6C, block 606 includes blocks 630-634. Flow proceeds inside block 606 to block 630, where the decoded address is used as an index. From block 630, flow proceeds to block 632. At block 632, a mapping is accessed using the index (again, the decoded address) to identify an X formatted version of the recoded address. The mapping relates a first set of possible values for the decoded address to a second set of corresponding possible values for the recoded address. The mapping is stored in a non-volatile memory of the semiconductor device. An example of the X format is the LP format used in FIG. 4A, and associated examples of the non-volatile memory, the first set of possible values for the decoded address and the second set of corresponding possible values for the recoded address are corresponding encoder 412, first set 413A and second set 413B of FIG. 4A. Another example of the X format is the QBR format of FIG. 5, and associated examples of the non-volatile memory, the first set of possible values for the decoded address and the second set of corresponding possible values for the recoded address are corresponding encoder 512, first set 513A and second set 513B of FIG. 5. From block 632, flow proceeds to block 634.

At block 634, the X formatted version of the recoded address is detranslated using a detranslator of the semiconductor device. Examples of the detranslator include LP format detranslator 430 of FIG. 4A and QBR detranslator 530 of FIG. 5. From block 634, flow proceeds outside block 606 to block 608. In FIG. 6C, block 608 includes a block 636. Flow proceeds inside block 608 to block 636. At block 636, the unformatted version of the recoded address is used for making the comparison.

Figure 6D:
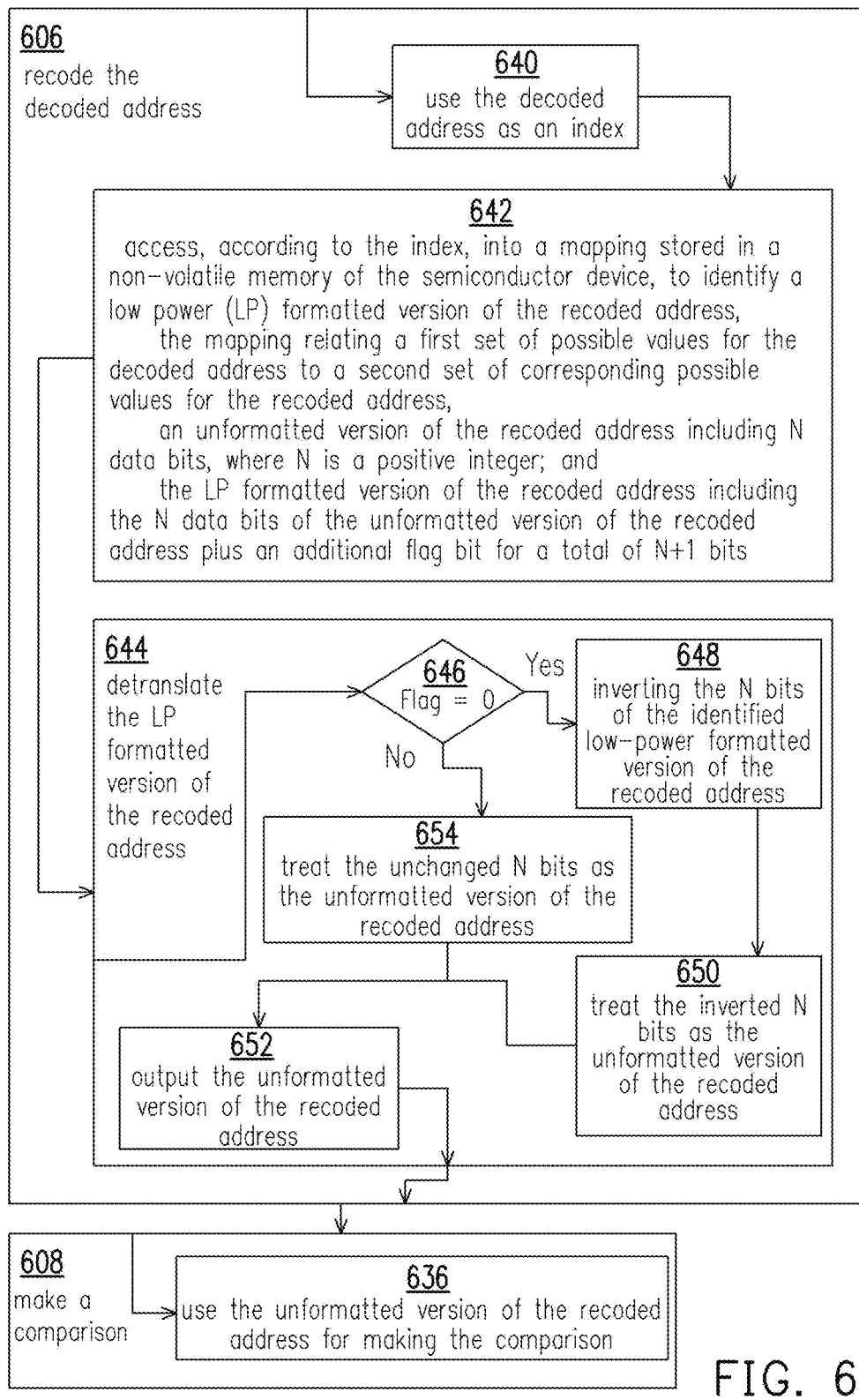
FIG. 6D is another flowchart showing the first and second bocks of FIG. 6A in more detail, in accordance with at least one embodiment of the present disclosure.

FIG. 6D is a flowchart showing blocks 606-608 of FIG. 6A in more detail, in accordance with at least one embodiment of the present disclosure.

In FIG. 6D, block 606 includes blocks 640-644. Flow proceeds inside block 606 to block 640, where the decoded address is used as an index. From block 640, flow proceeds to block 642. At block 642, a mapping is accessed using the index (again, the decoded address) to identify a low power (LP) formatted version of the recoded address. The mapping relates a first set of possible values for the decoded address to a second set of corresponding possible values for the recoded address. The unformatted version of the recoded address includes N bits. The LP formatted version of the recoded address includes the N bits of the unformatted version of the recoded address plus an additional flag bit for a total of N+1 bits. The mapping is stored in a non-volatile memory of the semiconductor device. An example of LP format is the LP format used in FIG. 4A, and associated examples of the non-volatile memory, the first set of possible values for the decoded address and the second set of corresponding possible values for the recoded address are corresponding encoder 412, first set 413A and second set 413B of FIG. 4A. From block 642, flow proceeds to block 644.

At block 644, the LP formatted version of the recoded address is detranslated. An example of the detranslator is LP format detranslator 430 of FIG. 4A. Block 644 includes blocks 646-654. Flow proceeds inside block 644 to block 646, where a decision is made whether the flag bit is set to logical zero. Examples of the flag bits are shown as bits b4 in table 460 of FIG. 4D.

If the result of the decision at block 646 is yes (namely, the flag bit is set to logical zero), then flow proceeds to block 648. At block 648, the N bits of the LP formatted version of the recoded address are inverted and the flag bit is discarded. As an example of a circumstance in which the N bits of the LP formatted version of the recoded address are inverted, consider the row of table 460 in which the LP formatted recoded address bits b3:b0=0110 and the flag bit b4=0. Accordingly, bits b3:b0 of the LP formatted recoded address are inverted to produce bits b3:b0 of the unformatted recoded address such that bits b3:b0 of the unformatted recoded address become b3:b0=1001, and the flag bit b4 is discarded. From block 648, flow proceeds to block 650. At block 650, the inverted N bits are treated as the unformatted version of the recoded address. From block 650, flow proceeds to block 652. At block 652, the unformatted version of the recoded address is output.

If the result of the decision at block 646 is no (namely, the flag bit is NOT set to logical zero), then flow proceeds to block 654. At block 654, the N bits of the LP formatted version of the recoded address are NOT changed and the flag bit is discarded. As an example of a circumstance in which the N bits of the LP formatted version of the recoded address are NOT inverted, consider the row of table 460 in which the LP formatted recoded address bits b3:b0=0111 and the flag bit b4=1. Accordingly, bits b3:b0 of the LP formatted recoded address are not changed such that bits b3:b0 of the unformatted recoded address become b3:b0=0111, and the flag bit b4 is discarded. From block 654, flow proceeds to block 652, discussed above.

From block 644, flow proceeds outside block 606 to block 608. In FIG. 6D, block 608 includes block 636. Flow proceeds inside block 608 to block 636. At block 636, the unformatted version of the recoded address is used for making the comparison.

An aspect of the present disclosure is directed to a method of detecting an address decoding error of a semiconductor device, the method including: decoding an original address, with an address decoder of the semiconductor device, to form a corresponding decoded address; recoding the decoded address, with an encoder of the semiconductor device, to form a recoded address; making a comparison, with a comparator of the semiconductor device, of the recoded address and the original address; and detecting an address decoding error based on the comparison. Regarding the method, each of the original address and the recoded address has N bits, where N is a positive integer; and the decoded address has $2^N$ bits. Regarding the method, the recoding the decoded address includes: using the decoded address as an index; and accessing, according to the index, a mapping stored in a non-volatile memory of the semiconductor device, the mapping relating a first set of possible values for the decoded address to a second set of corresponding possible values for the recoded address. Regarding the method, the recoding the decoded address includes: using the decoded address as an index; and accessing, according to the index, a mapping stored in a non-volatile memory of the semiconductor device; wherein the mapping relates a first set of possible values for the decoded address to a second set of corresponding possible values for the recoded address. Regarding the method, the recoding the decoded address includes: using the decoded address as an index; and accessing, according to the index, into a mapping stored in a non-volatile memory of the semiconductor device; wherein the mapping relates a first set of possible values for the decoded address to a second set of corresponding possible values for the recoded address; the mapping represents the second set of corresponding possible values for the recoded address in an X format, a given instance of the X formatted version of the recoded address being different than an unformatted version of the recoded address; the accessing identifies a corresponding X formatted version of the recoded address; the recoding the decoded address further includes detranslating the X formatted version of the recoded address into a corresponding unformatted version of the recoded address; and the making a comparison includes using the unformatted version of the recoded address. Regarding the method, the X format is a low power format; the unformatted version of the recoded address includes N bits, where N is a positive integer; the low power formatted version of the recoded address includes the N bits of the unformatted version of the recoded address plus an additional flag bit for a total of N+1 bits; and the detranslating includes: for a first circumstance in which the flag bit of the identified low power formatted version of the recoded address is set to zero, inverting the N bits of the identified low power formatted version of the recoded address, and outputting the inverted N bits as the unformatted version of the recoded address; and for a second circumstance in which the flag bit of the identified low power formatted version of the recoded address is set to one, outputting the N bits of the identified low power formatted version of the recoded address as the unformatted version of the recoded address. Regarding the method the X format is a Q bit ROM (QBR) format. Regarding the method, the unformatted version of the recoded address includes N bits, where N is a positive integer; and the QBR formatted version of the recoded address includes N/Q bits, where Q is a positive integer such that N/Q=U, where U is a positive integer. Regarding the method, the making a comparison includes: bitwise comparing the recoded address and the original address.

Another aspect of the present disclosure is directed to a system for detecting an address decoding error of a semiconductor device, the system including: a decoder of the semiconductor device configured to decode an original address to form a corresponding decoded address; an encoder of the semiconductor device configured to generating, using a look-up-table, a recoded address based on the decoded address; and comparison circuitry of the semiconductor device configured to bitwise compare the recoded address and the original address, and detect an address decoding error based on the comparison. Regarding such a system, the encoder includes a non-volatile memory. Regarding such a system, each of the original address and the recoded address has N bits, where N is a positive integer; and the decoded address has $2^N$ bits. Regarding such a system, the decoded address has a greater number of bits than each of the original address and the recoded address. Regarding such a system, the encoder is further configured as a mapping which relates a first set of possible values for the decoded address to a second set of corresponding possible values for the recoded address; the decoded address is provided to the encoder as an index; and the encoder is yet further configured to output the corresponding recoded address based on the index. Regarding such a system, the encoder is further configured as a mapping which relates a first set of possible values for the decoded address to a second set of corresponding possible values for the recoded address; the mapping represents the second set of corresponding possible values for the recoded address in pre-defined X format, a given instance of the X formatted version of the recoded address being different than an unformatted version of the recoded address; the decoded address is provided to the encoder as an index; the encoder is yet further configured to output the corresponding recoded address based on the index. Regarding such a system, the system further includes: a format detranslator configured to receive, from the encoder, an X formatted version of the recoded address, and detranslate the X formatted version of the recoded address into a corresponding unformatted version of the recoded address; and the comparison circuitry is further configured to use the unformatted version of the recoded address for making the comparison. Regarding such a system, the X format is a low power format; the unformatted version of the recoded address includes N bits, where N is a positive integer; the low power formatted version of the recoded address includes the N bits of the unformatted version of the recoded address plus an additional flag bit for a total of N+1 bits; and the format detranslator is further configured to, for a first circumstance in which the flag bit of the identified low power formatted version of the recoded address is set to zero, invert the N bits of the identified low power formatted version of the recoded address, and output the inverted N bits as the unformatted version of the recoded address, and for a second circumstance in which the flag bit of the identified low power formatted version of the recoded address is set to one, output the N bits of the identified low power formatted version of the recoded address as the unformatted version of the recoded address. Regarding such a system, the format detranslator includes N number of XOR gates corresponding to the N bits of the identified low power formatted version of the recoded address. Regarding such a system, the X format is a Q bit ROM format.

Yet another aspect of the present disclosure is directed to a memory system of a semiconductor device, the system including: a decoder of the semiconductor device configured to decode an original address to form a corresponding decoded address; a memory cell array, in a non-volatile memory of the semiconductor device, configured to receive the decoded address; a read/write circuit configured to read data from or write data to the memory cell array; an encoder of the semiconductor device configured to form a recoded address based on the decoded address; and comparison circuitry of the semiconductor device configured to compare the recoded address and the original address, and detect an address decoding error based on the comparison. Regarding such a system, the encoder is further configured as a mapping which relates a first set of possible values for the decoded address to a second set of corresponding possible values for the recoded address; the decoded address is provided to the encoder as an index; the encoder is yet further configured to output the corresponding recoded address based on the index; the mapping represents the second set of corresponding possible values for the recoded address in a predefined X format, a given instance of the X formatted version of the recoded address being different than an unformatted version of the recoded address; the system further includes a format detranslator configured to receive, from the encoder, an X formatted version of the recoded address; and detranslate the X formatted version of the recoded address into a corresponding unformatted version of the recoded address; and wherein the comparison circuitry is further configured to use uses the unformatted version of the recoded address for making the comparison. Regarding such a system, the X format is a low power format; the unformatted version of the recoded address includes N bits, where N is a positive integer; the low power formatted version of the recoded address includes the N bits of the unformatted version of the recoded address plus an additional flag bit for a total of N+1 bits; and the format detranslator is further configured to, for a first circumstance in which the flag bit of the low power formatted version of the recoded address is set to zero, invert the N bits of the low power formatted version of the recoded address, and output the inverted N bits as the unformatted version of the recoded address; and, for a second circumstance in which the flag bit of the low power formatted version of the recoded address is set to one, output the N bits of the low power formatted version of the recoded address as the unformatted version of the recoded address.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for detecting an address decoding error of a semiconductor device, the system comprising:
   a decoder of the semiconductor device configured to decode an original address to form a corresponding decoded address, the decoded address having a greater number of bits than the original address;
   an encoder of the semiconductor device configured to form a recoded address based on the decoded address; and
   comparison circuitry of the semiconductor device configured to:
      compare the recoded address and the original address; and
      detect an address decoding error based on the comparison.

2. The system of claim 1, wherein:
the encoder includes a non-volatile memory, the non-volatile memory including a look-up-table; and
wherein the encoder is further configured to use the look-up-table when generating the recoded address.

3. The system of claim 1, wherein:
each of the original address and the recoded address has N bits, where N is a positive integer; and
the decoded address has $2^N$ bits.

4. The system of claim 1, wherein:
the decoded address has a greater number of bits than the recoded address.

5. The system of claim 1, wherein:
the encoder is further configured as a mapping which relates a first set of possible values for the decoded address to a second set of corresponding possible values for the recoded address;
the decoded address is provided to the encoder as an index; and
the encoder is further configured to output the recoded address based on the index.

6. The system of claim 1, wherein:
the encoder is further configured as a mapping which relates a first set of possible values for the decoded address to a second set of corresponding possible values for the recoded address;
the mapping represents the second set of possible values for the recoded address in an X format which is predefined, a given instance of the X formatted version of the recoded address being different than an unformatted version of the recoded address;
the decoded address is provided to the encoder as an index;
the encoder is yet further configured to output the recoded address based on the index;
the system further comprises:
   a format detranslator configured to:
      receive, from the encoder, an X formatted version of the recoded address; and
      detranslate the X formatted version of the recoded address into a corresponding unformatted version of the recoded address; and
the comparison circuitry is further configured to use the unformatted version of the recoded address for making the comparison.

7. The system of claim 6, wherein:
the X format is a low power format;
the unformatted version of the recoded address includes N bits, where N is a positive integer;
the low power formatted version of the recoded address includes the N bits of the unformatted version of the recoded address plus a flag bit for a total of N+1 bits; and
the format detranslator is further configured to:
   for a first circumstance in which the flag bit of the low power formatted version of the recoded address is set to zero:
      invert the N bits of the low power formatted version of the recoded address; and
      output the inverted N bits as the unformatted version of the recoded address; and
   for a second circumstance in which the flag bit of the low power formatted version of the recoded address is set to one:
      output the N bits of the low power formatted version of the recoded address as the unformatted version of the recoded address.

8. The system of claim 7, wherein the format detranslator includes:
N number of XOR gates corresponding to the N bits of the low power formatted version of the recoded address.

9. The system of claim 6, wherein:
the X format is a Q bit ROM format.

10. A memory system of a semiconductor device, the memory system comprising:
   a decoder of the semiconductor device configured to decode an original address to form a corresponding decoded address which has a greater number of bits than the original address;
   a memory cell array, in a non-volatile memory of the semiconductor device, configured to receive the decoded address;
   a read/write circuit configured to read data from or write data to the memory cell array;
   an encoder of the semiconductor device configured to form a recoded address based on the decoded address; and
   comparison circuitry of the semiconductor device configured to:
      compare the recoded address and the original address; and
      detect an address decoding error based on the comparison.

11. The memory system of claim 10, wherein:
the encoder is further configured as a mapping which relates a first set of possible values for the decoded address to a second set of corresponding possible values for the recoded address;
the decoded address is provided to the encoder as an index;
the encoder is yet further configured to output the recoded address based on the index;
the mapping represents the second set of corresponding possible values for the recoded address in an X format which is predefined, a given instance of the X formatted version of the recoded address being different than an unformatted version of the recoded address;
the memory system further comprises:
a format detranslator configured to:
receive, from the encoder, an X formatted version of the recoded address; and
detranslate the X formatted version of the recoded address into a corresponding unformatted version of the recoded address; and
the comparison circuitry is further configured to use uses the unformatted version of the recoded address for making the comparison.

12. The memory system of claim 11, wherein:
the X format is a low power format;
the unformatted version of the recoded address includes N bits, where N is a positive integer;
the low power formatted version of the recoded address includes the N bits of the unformatted version of the recoded address plus a flag bit for a total of N+1 bits; and
the format detranslator is further configured to:
for a first circumstance in which the flag bit of the low power formatted version of the recoded address is set to zero:
invert the N bits of the low power formatted version of the recoded address; and
output the inverted N bits as the unformatted version of the recoded address; and
for a second circumstance in which the flag bit of the low power formatted version of the recoded address is set to one:
output the N bits of the low power formatted version of the recoded address as the unformatted version of the recoded address.

13. The system of claim 1, wherein:
the comparison circuitry is further configured to compare by bitwise comparing the recoded address and the original address.

14. A system for detecting an address decoding error of a semiconductor device, the system comprising:
a decoder of the semiconductor device configured to decode an original address to form a corresponding decoded address which has a greater number of bits than the original address;
an encoder of the semiconductor device configured to form a recoded address based on the decoded address; and
comparison circuitry of the semiconductor device configured to:
compare the recoded address and the original address; and
detect an address decoding error based on the comparison; and wherein:
the encoder is further configured as a mapping which relates a first set of possible values for the decoded address to a second set of corresponding possible values for the recoded address;
the decoded address is provided to the encoder as an index; and
the encoder is further configured to output the recoded address based on the index.

15. The system of claim 14, wherein:
the encoder includes a non-volatile memory, the non-volatile memory including a look-up-table; and
wherein the encoder is further configured to use the look-up-table when generating the recoded address.

16. The system of claim 14, wherein:
each of the original address and the recoded address has N bits, where N is a positive integer; and
the decoded address has $2^N$ bits.

17. The system of claim 14, wherein:
the mapping represents the second set of corresponding possible values for the recoded address in an X format which is predefined, a given instance of the X formatted version of the recoded address being different than an unformatted version of the recoded address;
the decoded address is provided to the encoder as an index;
the encoder is yet further configured to output the recoded address based on the index;
the system further comprises:
a format detranslator configured to:
receive, from the encoder, an X formatted version of the recoded address; and
detranslate the X formatted version of the recoded address into a corresponding unformatted version of the recoded address; and
the comparison circuitry is further configured to use the unformatted version of the recoded address for making the comparison.

18. The system of claim 17, wherein:
the X format is a low power format;
the unformatted version of the recoded address includes N bits, where N is a positive integer;
the low power formatted version of the recoded address includes the N bits of the unformatted version of the recoded address plus a flag bit for a total of N+1 bits; and
the format detranslator is further configured to:
for a first circumstance in which the flag bit of the low power formatted version of the recoded address is set to zero:
invert the N bits of the low power formatted version of the recoded address; and
output the inverted N bits as the unformatted version of the recoded address; and
for a second circumstance in which the flag bit of the low power formatted version of the recoded address is set to one:
output the N bits of the low power formatted version of the recoded address as the unformatted version of the recoded address.

19. The system of claim 18, wherein the format detranslator includes:
N number of XOR gates corresponding to the N bits of the low power formatted version of the recoded address.

20. The system of claim 17, wherein:
the X format is a Q bit ROM format.

* * * * *